April 28, 1970 P. DUQUETTE ET AL 3,508,522

COMBINED DOCTORING MEANS

Filed Aug. 8, 1966 2 Sheets-Sheet 1

INVENTORS
PAUL DUQUETTE
MAURICE ST. ONGE
PETER McKENZIE
BY Richard J. Seligman
ATTORNEY April 28, 1970 P. DUQUETTE ETAL 3,508,522

COMBINED DOCTORING MEANS

Filed Aug. 8, 1966 2 Sheets-Sheet 2

INVENTORS
PAUL DUQUETTE
MAURICE ST. ONGE
PETER McKENZIE
BY Richard S. Seligman
ATTORNEY

United States Patent Office 3,508,522

Patented Apr. 28, 1970

3,508,522

COMBINED DOCTORING MEANS

Paul Duquette, Nashua, Maurice O. St. Onge, Manchester, and Peter McKenzie, Nashua, N.H., assignors to Sanders Associates, Inc., Nashua, N.H., a corporation of Delaware Filed Aug. 8, 1966, Ser. No. 570,835

Int. Cl. B05c *9/12*

U.S. Cl. 118—50 2 Claims

ABSTRACT OF THE DISCLOSURE

An apparatus for removing excess molten solder from a printed circuit board and simultaneously clearing holes in the board of solder in which the board is drawn over two upstanding spaced apart wipers having a region of low pressure therebetween and under a third wiper positioned intermediate the first two.

Figure 1:
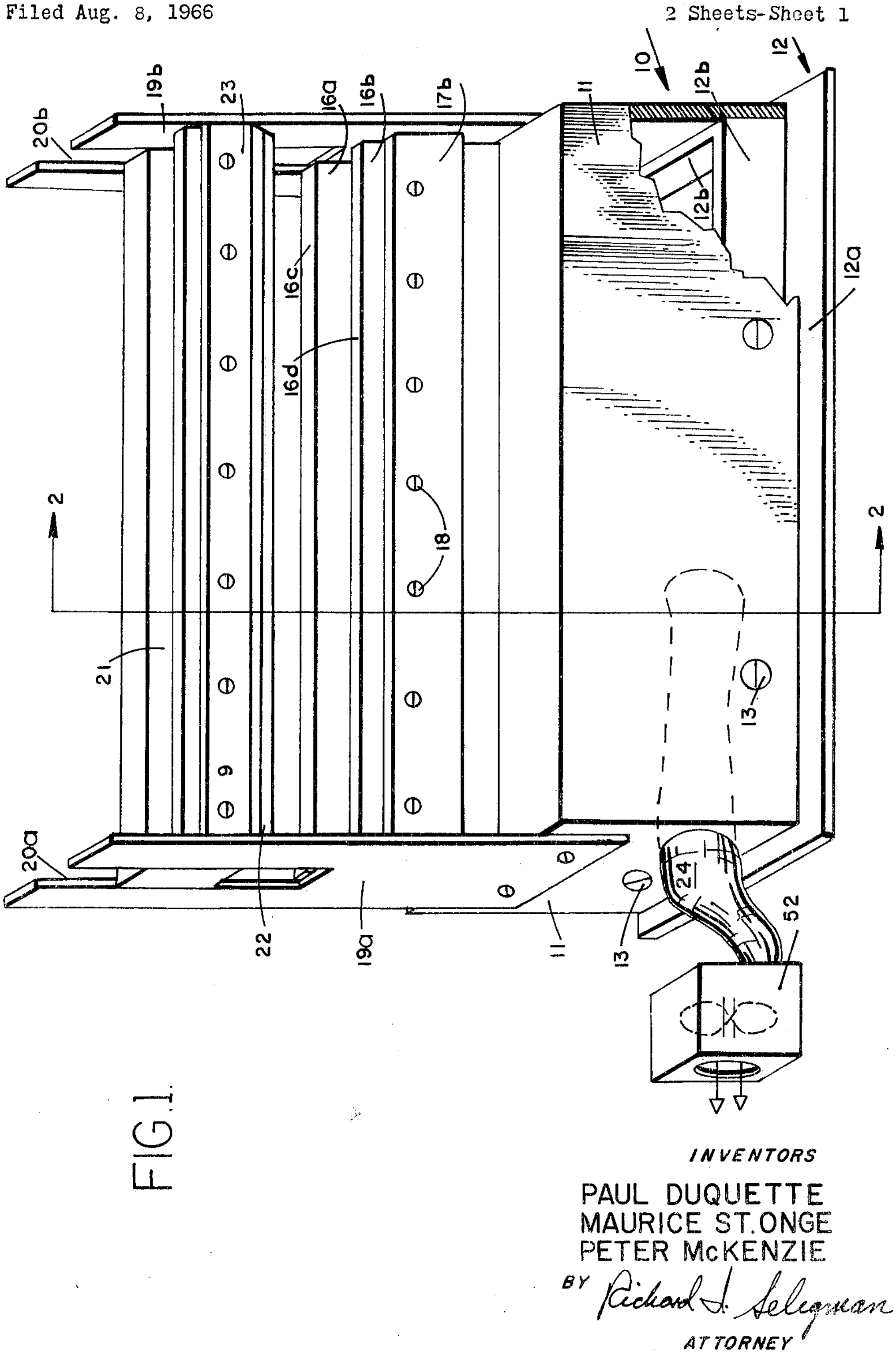

This invention relates generally to the preparation of printed circuit boards, and more particularly relates to an apparatus for controlling the thickness of solder remaining on a printed circuit board following a hot-tinning operation in a molten solder bath.

The term printed circuit board has been applied to forms of two-dimensional electronic circuits comprised of conductive paths carried on a dielectric base material. Most printed circuit boards today are made by an etching process such as photoengraving wherein a photographic negative of the desired circuit outline is placed in contact with a copper-clad base material whose surface has been treated with a photosensitive emulsion. This negative is then exposed on the emulsion surface and followed by conventional photographic development. This developed board is then washed and placed in an etching bath where all unprotected copper is dissolved from the clad base material leaving the desired conductive pattern.

The thickness of the copper circuit remaining may be in the order of .001 to .003 inch, depending on the current-carrying requirements. To impart greater versatility in the use of printed circuit boards, both sides of the base material board may carry a circuit which may be connected at one or more points by apertures through the board.

To provide added corrosion and wear resistance as well as low contact resistance and solderability when components are connected into the circuit, these copper etched circuit patterns are frequently coated with solder by merely immersing the entire board into a molten solder bath of about 210° C. for a few seconds and then withdrawing same. The solder has a natural affinity for the metallic surface of the copper circuitry, and will accordingly adhere to it; at the same time, this molten solder exhibits no affinity for the dielectric base material, and so does not adhere to it, leaving therefore only the copper circuit coated.

In following this prior art practice of hot solder dipping or hot-tinning, so-called, a number of disadvantages accrue, among which are (1) that the solder coating is apt to be uneven in thickness and form cohesive globules at random points on the circuit; and (2) in the event the circuit board is apertured, this solder bath will invariably fill-up the holes thereby preventing the insertion therethrough of electrical components.

This invention overcomes these prior art criticisms by providing a combination doctor blade and vacuum apparatus through which a circuit board, upon emerging from the molten solder bath, is passed and which by means of this doctoring action on both surfaces of the board removes excesses of solder plating from the circuit. At the same time, the vacuum clears holes of any molten solder which bridges across these apertures.

It is accordingly an object of this invention to provide an apparatus for doctoring molten solder on the circuit surface of printed circuit boards.

It is a further object of this invention to provide a means for clearing apertures in the circuit board of any molten solder which may be bridged thereacross.

A feature of this invention is that printed circuit boards utilizing the apparatus and techniques herein disclosed are not subjected to any bending, twisting, or other stresses or strains which could fracture the thin printed circuit or otherwise impair its electrical continuity.

Figure 2:
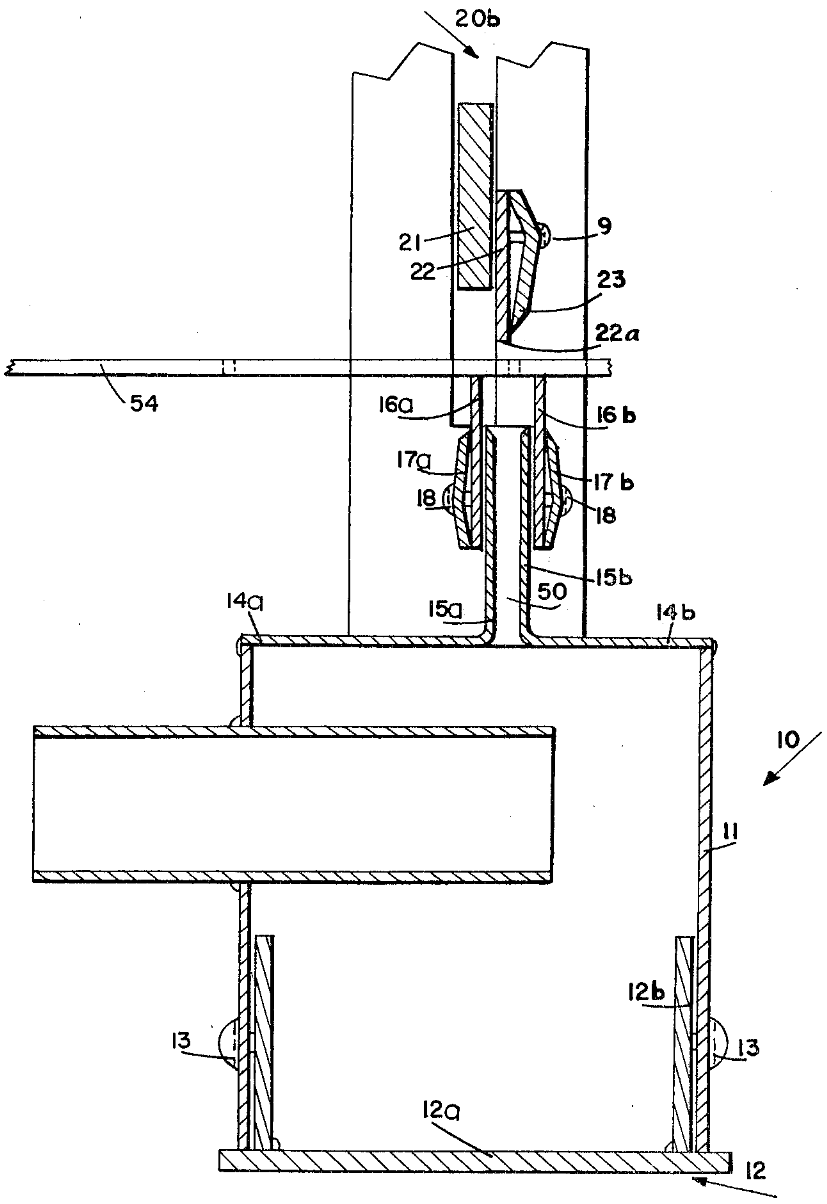

With the afore objects and features in mind, reference is now had to the drawings which illustrate one preferred embodiment of this invention and in which:

FIG. 1 depicts a perspective view of the squeegee type soldering machine of this disclosure, and FIG. 2 illustrates a cross-sectional view taken on line 2—2 of FIG. 1 and additionally includes a schematic representation of a printed circuit board in operative relation with the machine.

Referring now with greater particularity to the drawings, there is shown in FIG. 1 a vacuum tank 10 comprised of side walls 11 and removable base 12. Base 12 is formed from a baseplate **12*a* with upstanding portions 12*b*. Base 12 and tank 10 are dimensioned so that when assembled the inner periphery of side walls 11 fit closely over upstanding portions 12*b*. Fastening means such as screws 13 are used to draw members 11 and 12*b*** into tight face-to-face relation.

Welded or otherwise affixed across the top edges of side walls 11 are two angle members **14*a*, 14*b* shown in FIG. 2 whose opposed upstanding portions 15*a*, 15*b* are in about ¼" in spaced apart relation forming a vacuum channel 50 therebetween. Fastened to 15*a*, 15*b* respectively and coextensive in length therewith, are doctor blades 16*a*, 16*b* made of heat resistant silicone elastomers or other suitable material. These doctor blades are held in place by clamping bars 17*a*, 17*b* which are fastened by suitable screws 18 through doctor blades 16*a*, 16*b* into 15*a*, 15*b*** respectively.

Affixed to both ends of vacuum tank 10 are side brackets **19*a*, 19*b* which are in contiguous relation with the terminal ends of the doctor blade assemblies 15, 16, 17. Slots 20*a*, 20*b* are cut out of side brackets 19*a*, 19*b* substantially in a coplanar relation with doctor blade 16*a***.

Slidably carried in slots **20*a*, 20*b* is another doctor-blade assembly comprised of a rigid bar 21 to which is fastened an elastomeric doctor blade 22 held together by a clamping bar 23 and screws 9. Each of these components is also coextensive in length with one another, the terminal ends of which are in contiguous relation with side brackets 19*a*, 19*b*. Slots 20*a*, 20*b* are long enough so that the operative edge 22*a* of doctor blade 22 can be positioned in substantial coplanar relation with the operative edge portions 16*c*, 16*d*, respectively of doctor blades 16*a*, 16*b***.

It is to be noted as shown in FIG. 2 that doctor blade 22 is laterally positioned between doctor blades **16*a*, 16*b*** in order to balance the vertical forces acting on a circuit board placed therebetween and thereby render an effective wiping action.

Sealingly inserted into one wall 11 is a conduit pipe 24 communicating the interior of tank 10 with a conventional vacuum source 52 which in turn generates a partial vacuum in vacuum channel 50.

In operation, the device would function as follows: upon withdrawing a circuit board 54 from a molten solder bath, an end of the board as illustrated in FIG. 2 is placed horizontally on the two bottom doctor blades **16*a*, 16*b***.

The upper doctor blade 22 is lowered into positive contact with the upper surface of the circuit board and the board is then drawn (by pliers or other gripping means) through these doctor blades which act as "squeegees" and wipe all solder excesses away. As the board is drawn over vacuum channel 50, any molten solder bridging the holes is withdrawn into tank 10, leaving clean holes in the circuit board for eyelets or leads of any electrical hardware to be added subsequently. Because of the high heat at which the circuit board is maintained in the molten solder bath, the solder on the board will remain in a molten state for a time sufficient to complete the operation. If it is desired to maintain the solder deposited on the boards in a molten state for longer periods of time, heaters can be appropriately positioned within the equipment so as not to interfere with the wiping apparatus. Whenever necessary, base 12 can be removed to empty solder residue drawn in from this hole cleaning operation.

Should the holes in the circuit board be plated with a conductive coating, the solder remaining on this hole surface after passing over vacuum channel 50 is of substantially equal thickness all around the wall portion thereof. The result of this operation yields a printed circuit board with clean apertures and whose circuitry is covered with a smooth layer of solder plating without exhibiting the excessive globules and jagged peaks of prior art techniques.

It will be understood that various changes in the details, materials, setups and arrangements of parts, which have been herein described and illustrated in order to explain the nature of the invention, may be made by those skilled in the art within the principle and scope of the invention as expressed in the appended claims.

We claim:

1. Apparatus for operating upon a printed circuit board as it emerges from a molten soldering bath, comprising, first and second vertically upstanding doctor blades spaced apart to form a narrow channel therebetween and serving to support one end of said circuit board temporarily in a substantially horizontal position, a third, vertically depending, doctor blade laterally positioned between said first and second blades and vertically positioned above said circuit board and vertically adjustable to positions in and out of engagement with the upper surface of said board, and means for reducing the pressure of the air in said channel to below atmospheric pressure, whereby, if a board emerging from a molten soldering bath be placed horizontally with one end overlying said channel and supported by said first and second doctor blades, if said third doctor blade be lowered to engage the upper surface of said board and if the board then be drawn laterally with said first and second blades in engagement with the lower surface and with said third blade in engagement with the upper surface, said blades would wipe the excess solder from both sides of said board and any holes in said board would be cleared of solder by air being drawn therethrough.

2. Apparatus for operating upon a printed circuit board as claimed in claim 1 in which said doctor blades are formed of a heat resistant elastomeric material.

References Cited

UNITED STATES PATENTS

| | | | |
|---|---|---|---|
| 326,687 | 9/1885 | Sparks | 118—124 X |
| 765,507 | 7/1904 | Noyes | 118—50 X |
| 1,752,972 | 4/1930 | Beaver | 118—50 |
| 2,131,512 | 9/1938 | Gwinn. | |
| 2,162,403 | 6/1939 | Howard | 118—124 X |
| 2,237,068 | 4/1941 | Bradner | 118—126 X |
| 2,289,753 | 7/1942 | Capstatt. | |
| 2,354,033 | 7/1944 | McGladrey et al. | 118—50 X |
| 3,207,128 | 9/1965 | Leavitt et al. | 118—110 X |
| 3,271,187 | 9/1966 | Chen et al. | 118—110 X |

MORRIS KAPLAN, Primary Examiner

U.S. Cl. X.R.

118—122